United States Patent
Chen et al.

(10) Patent No.: US 11,048,654 B2
(45) Date of Patent: Jun. 29, 2021

(54) SYSTEMS AND METHODS FOR PROVIDING MULTIPLE MEMORY CHANNELS WITH ONE SET OF SHARED ADDRESS PINS ON THE PHYSICAL INTERFACE

(71) Applicant: Innogrit Technologies Co., Ltd., Shanghai (CN)

(72) Inventors: Shawn Chen, San Jose, CA (US); Wei Jiang, Fremont, CA (US); Lin Chen, Cupertino, CA (US)

(73) Assignee: INNOGRIT TECHNOLOGIES CO., LTD., Shanghai (CN)

( * ) Notice: Subject to any disclaimer, the term of this patent is extended or adjusted under 35 U.S.C. 154(b) by 127 days.

(21) Appl. No.: 16/169,525

(22) Filed: Oct. 24, 2018

(65) Prior Publication Data
US 2020/0133903 A1   Apr. 30, 2020

(51) Int. Cl.
| G06F 13/28 | (2006.01) |
| G06F 1/12 | (2006.01) |
| G11C 7/10 | (2006.01) |
| G06F 13/16 | (2006.01) |

(52) U.S. Cl.
CPC .............. *G06F 13/287* (2013.01); *G06F 1/12* (2013.01); *G06F 13/1689* (2013.01); *G11C 7/1075* (2013.01)

(58) Field of Classification Search
CPC ...... G06F 13/1689; G06F 13/287; G06F 1/12; G11C 7/10; G11C 7/1075
See application file for complete search history.

(56) References Cited

U.S. PATENT DOCUMENTS

| 2006/0077710 A1* | 4/2006 | Martines ................ G11C 16/28 365/185.2 |
| 2015/0347331 A1* | 12/2015 | Park .................... G06F 13/1689 710/308 |

OTHER PUBLICATIONS

"Frequency Division and Time division multiplexing." Published by GeeksforGeeks. pp. 1-3. Also available at https://www.geeksforgeeks.org/frequency-division-and-time-division-multiplexing/. (Year: 2020).*
"Multiplexing in Mobile Computing." as captured by WayBack Machine (Internet Archive) on May 18, 2018. Published on Minigranth. pp. 1-5. Also available at https://web.archive.org/web/20180518015536/ https://www.minigranth.com/mobile-computing/multiplexing-mobile-computing/. (Year: 2018).*

* cited by examiner

*Primary Examiner* — Jane Wei
(74) *Attorney, Agent, or Firm* — IPro, PLLC; Xiaomin Huang

(57) ABSTRACT

Systems, apparatus and methods are provided to combine multiple channels in a multi-channel memory controller to save area and reduce power and cost. An apparatus may comprise a first memory controller configured to access a first channel using a first protocol, a second memory controller configured to access a second channel using a second protocol that is different from the first protocol and a physical interface coupled to the first memory controller and a second memory controller. The physical interface may comprise a set of pins for an address and command bus shared by the first memory controller and the second memory controller for the first memory controller and the second memory controller to send address or command to respective channels by time division multiplexing.

15 Claims, 6 Drawing Sheets

SYSTEMS AND METHODS FOR PROVIDING MULTIPLE MEMORY CHANNELS WITH ONE SET OF SHARED ADDRESS PINS ON THE PHYSICAL INTERFACE

TECHNICAL FIELD

The disclosure herein relates to memory interface, particularly relates to multi-channel memory interface architecture.

BACKGROUND

Computing systems need to use storage medium to maintain and store data and instructions. There are typically two types of storage medium: volatile and non-volatile. Volatile storage, such as Random Access Memory (RAM), loses its state when power is interrupted to the device; non-volatile storage, such as floppy disks, hard drives, magnetic tapes, optical discs, maintains its state even if power is interrupted. These two types of storage are typically accessed via different interfacing technologies that vary significantly and are generally incompatible. Recent development of new storage and memory technologies normally packs more and more storage medium modules into one computing system. Thus, a modern storage controller is usually configured to support multiple channels to access multiple storage units.

A multi-channel memory interface architecture has to have the necessary interface to communicate with multiple storage units. But the physical interface of such an architecture is a valuable resource because the space for connection pins is limited. Moreover, recent development in non-volatile memory is providing more and more advanced memory media, which is different from the traditional RAM and traditional non-volatile storage. Therefore, there is a need in the art for improved multi-channel memory interface architecture design, to utilize the advanced new memory media features.

SUMMARY

The disclosed subject matter relates to systems, methods, and devices that combines multiple channels in a memory controller. According to various aspects of the present disclosure, the provided techniques may share an address/command (AD/CMD) bus among a plurality of memory channels whereas each channel may have a separate data bus. The exemplary memory controllers may be implemented in a stand-alone memory controller, such as a DRAM controller of a computing system, or as part of a storage controller, such as a solid state drive (SSD) controller.

In an exemplary embodiment, there is provided an apparatus, comprising: a first memory controller configured to access a first channel using a first protocol; a second memory controller configured to access a second channel using a second protocol that is different from the first protocol; and a physical interface coupled to the first memory controller and a second memory controller. The physical interface comprises a set of pins for an address and command bus shared by the first memory controller and the second memory controller for the first memory controller and the second memory controller to send address or command to respective channels.

In another exemplary embodiment, there is provided a method, comprising: receiving a first command from a first channel controller of a multi-channel memory controller at a physical interface of the multi-channel memory controller; receiving a second command from a second channel controller of the multi-channel memory controller at the physical interface. The first command may be a command of a first protocol and the second command may be a command of a second protocol, and the first memory protocol may be different from the second memory protocol. The method may further comprise sending the first command during a first time slot from the physical interface via a set of pins to a first memory module of a first memory type; and sending the second command during a second time slot from the physical interface via the set of pins to a second memory module of a second memory type. The set of pins may be shared by the first channel and second channel. In one embodiment, the first protocol and the second protocol may be compatible protocols.

In yet another exemplary embodiment, there is provided a non-transitory machine-readable medium having information, which when read by a hardware processor system, causes the hardware processor system to perform: receiving a first command from a first channel controller of a multi-channel memory controller at a physical interface of the multi-channel memory controller; receiving a second command from a second channel controller of the multi-channel memory controller at the physical interface; sending the first command during a first time slot from the physical interface via a set of pins to a first memory module of a first memory type; and sending the second command during a second time slot from the physical interface via the set of pins to a second memory module of a second memory type. The first command may be a command of a first protocol and the second command may be a command of a second protocol, and the first memory protocol may be different from the second memory protocol. The set of pins may be shared by the first channel and second channel.

DETAILED DESCRIPTION

Figure 1A:
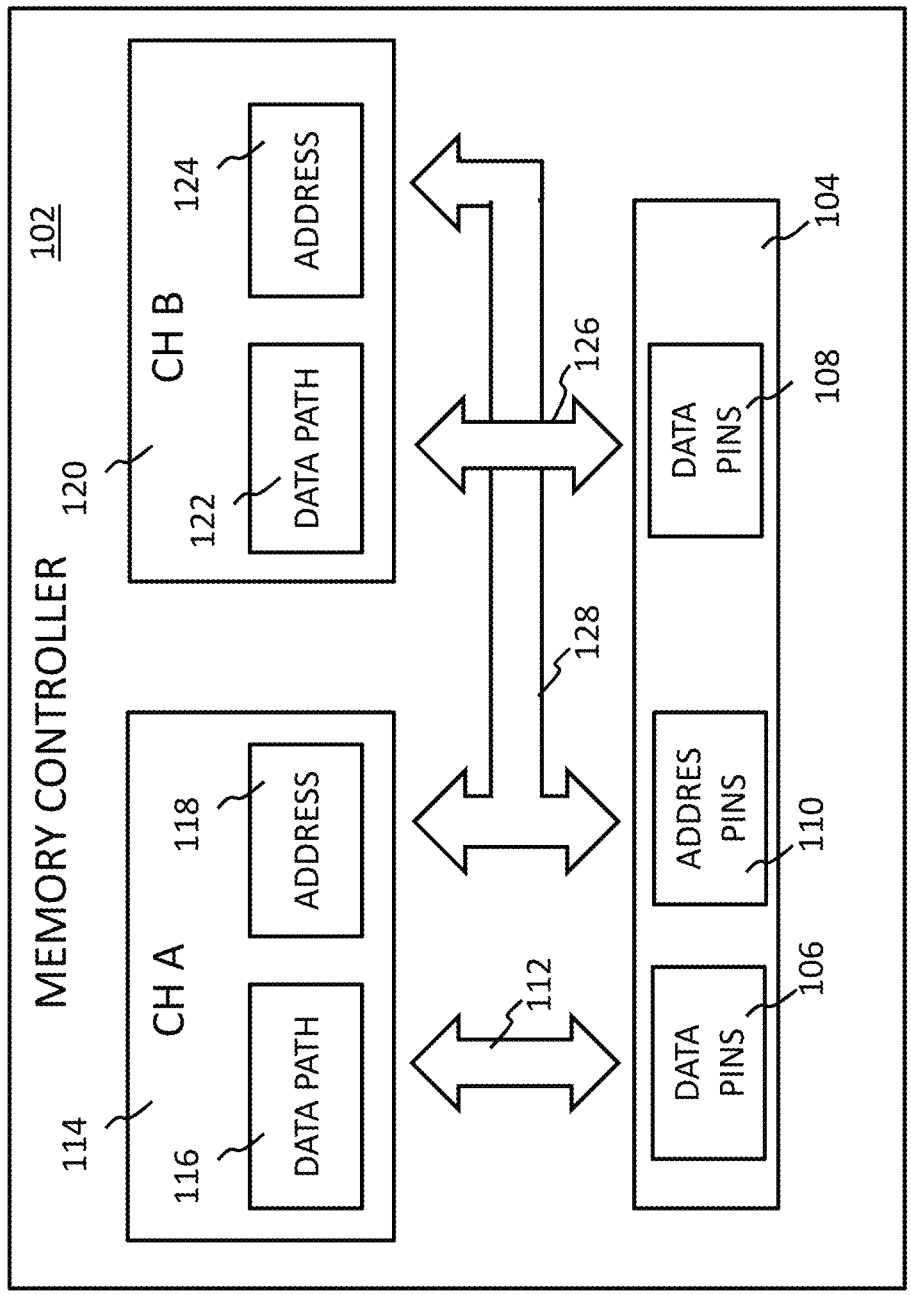
FIG. 1A schematically shows a memory controller with a multi-channel memory interface architecture in accordance with an embodiment of the present disclosure.

Specific embodiments according to the present disclosure will now be described in detail with reference to the accompanying figures. Like elements in the various figures are denoted by like reference numerals for consistency.

The present disclosure provides systems and methods for combining multiple channels in a multi-channel memory interface architecture. An exemplary memory controller may implement a multi-channel memory interface architecture to provide support for two or more channels. Each channel may be independent by having a respective dedicated data bus and being controlled independently. Multiple channels, however, may share a single address and command bus. For example, a memory controller according to one embodiment may have a physical interface (PHY) configured with multiple channels for multiple memory modules. Each memory module may be a memory unit for storing data and instructions. The memory modules that may be coupled to the channels may include, for example, Synchronous Dynamic Random Access Memory (SDRAM), Double Data Rate SDRAM (DDR), DDR version 2 (DDR2) SDRAM (DDR2), DDR version 3 SDRAM (DDR3), DDR version 4 SDRAM (DDR4), NAND flash memories, NOR flash memories, Magnetoresistive Random Access Memory (MRAM), Resistive Random Access Memory (RRAM), Phase Change Random Access Memory (PCRAM), Nano-RAM, 3D XPoint memory, etc.

In various embodiments, by sharing a single address/command bus the area of the silicon die used for address bus may be reduced. Moreover, data buses with different widths may be combined in one memory system. For example, a memory system may have a total data bus width that may not be power of 2. In an embodiment, for example, the total data bus width may be 48-bit, which may be a 32-bit data bus for one channel combined with a 16-bit data bus for another channel. In addition, different memory types may be combined to form a flexible memory system. For example, one channel may be configured for DRAM and another channel may be configured for MRAM, or one channel may be configured for DDR3 and another channel may be configured for DDR4. In various embodiments, there is, however, no significant impact on total bandwidth because these multiple channels may be fully utilized, for example, by time division multiplexing of the address/command bus.

FIG. 1A schematically shows a memory controller 102 with a multi-channel memory interface architecture in accordance with an embodiment of the present disclosure. The memory controller 102 may comprise a physical interface 104, a first channel controller 114, a second channel controller 120, a first data bus 112, a second data bus 126 and an address bus 128.

The first channel controller 114 may provide a first channel, denoted as CH A, to the memory controller 102. The first channel controller 114 may comprise a data path component 116 and an address component 118. The data path component 116 may be configured to handle data to be written to and/or received from a memory module (not shown) attached to the first channel. The data path component 116 may be coupled to a first set of data pins 106 of the physical interface 104 via the first data bus 112. The first set of data pins 106 may be coupled to the memory module attached to the first channel via an external data bus (not shown). The address component 118 may be configured to specify the address (where on the memory module the data to be written to or read from) and issue any commands to the first channel. Thus, the address component 118 may also be referred to as an address/command component. The address component 118 may be coupled to a set of address/command pins 110 of the physical interface 104 via the address bus 128. The set of address/command pins 110 of the physical interface 104 may also be referred to as the address PHY. Because the address bus 128 may also be used for transferring commands, it may also be referred to as an address/command (AD/CMD) bus.

The second channel controller 120 may provide a second channel, denoted as CH B, to the memory controller 102. The second channel controller 120 may comprise a data path component 122 and an address component 124. The data path component 122 may be configured to handle data to be written to and/or received from a memory module (not shown) attached to the second channel. The data path component 122 may be coupled to a second set of data pins 108 of the physical interface 104 via the second data bus 126. The second set of data pins 108 may be coupled to the memory module attached to the second channel via another external data bus (not shown). The address component 124 may be configured to specify the address (where on the memory module the data to be written to or read from) and issue any commands to the second channel. Similar to the address component 118, the address component 124 may also be referred to as an address/command component. Moreover, the address component 124 may also be coupled to the set of address/command pins 110 of the physical interface 104 via the address bus 128. That is, the address bus 128 may be shared by first channel controller 114 and the second channel controller 120.

The first channel controller 114 may be configured according to a first protocol and the second channel controller 120 may be configured according to a second protocol. As used herein, a protocol may refer to a standard or specification that defines how a memory module (e.g., a memory chip) may be accessed. Thus, the memory module attached to each of the first channel controller 114 and second channel controller 120 may be a corresponding memory type. Each of the first protocol and the second protocol may be one of a known memory protocol, such as but not limited to, SDRAM, DDR, DDR2, DDR3, DDR4, NAND, NOR, MRAM, RRAM, PCRAM, Nano-RAM, or 3D XPoint, or any future developed memory protocol. In various embodiments, the first protocol may be different from the second protocol.

In some embodiments, the first protocol may be different from the second protocol but similar. For example, general DDR-SDRAM protocols such as DDR3 and DDR4 may be protocol-compatible with each other, and thus in an embodiment, the first protocol may be DDR3 with the memory module attached to the first channel being a DDR3 memory module and the second protocol may be DDR4 with the memory module attached to the first channel being a DDR4 memory module. As another example, MRAM may be pin interface-compatible with general DDR-SDRAM protocols such as DDR3 and DDR4, and thus in another embodiment, the first protocol may be SDRAM with the memory module attached to the first channel being a SDRAM memory module and the second protocol may be MRAM with the memory module attached to the first channel being a MRAM memory module. As used herein, pin interface-compatible may mean that a same set of physical pins may be used by both protocol, but the function of each pin may be the same or different for each memory module. Therefore, embodiments according to the present disclosure may share one set of address pins via a time division multiplexing scheme for a plurality types of memory modules attached to one external data bus. In an embodiment, the time division multiplexing scheme may be implemented such that each clock cycle of the physical interface 104 may be designated for a specific channel. For example, channel A may be designated to use even clock cycles and channel B may be designated to use odd clock cycles.

Although FIG. 1A shows a memory controller 102 shows two channels, one or more additional channels may be added such that each additional channel may have a dedicated data bus but share the same set of address pins 110 of the physical interface 104. Accordingly, a multi-channel memory interface architecture according to embodiments of the present disclosure may save physical space on the physical interface.

In some embodiments, as shown in FIG. 1A, the address pins 110 of physical interface 104 may be coupled to the address component 118 of the first channel controller 114 and address component 124 of the second channel component 120 via the shared address bus 128. That is, the same set of address pins 110 may be shared by the first channel controller 114 and the second channel controller 120. In an embodiment, one address pin may be mapped to same usage for all channels sharing the address bus. For example, a bank address zero (BA0) pin of the physical interface 104 may be mapped to BA0 outputs of both the first channel controller 114 and the second channel controller 120.

Figure 1B:
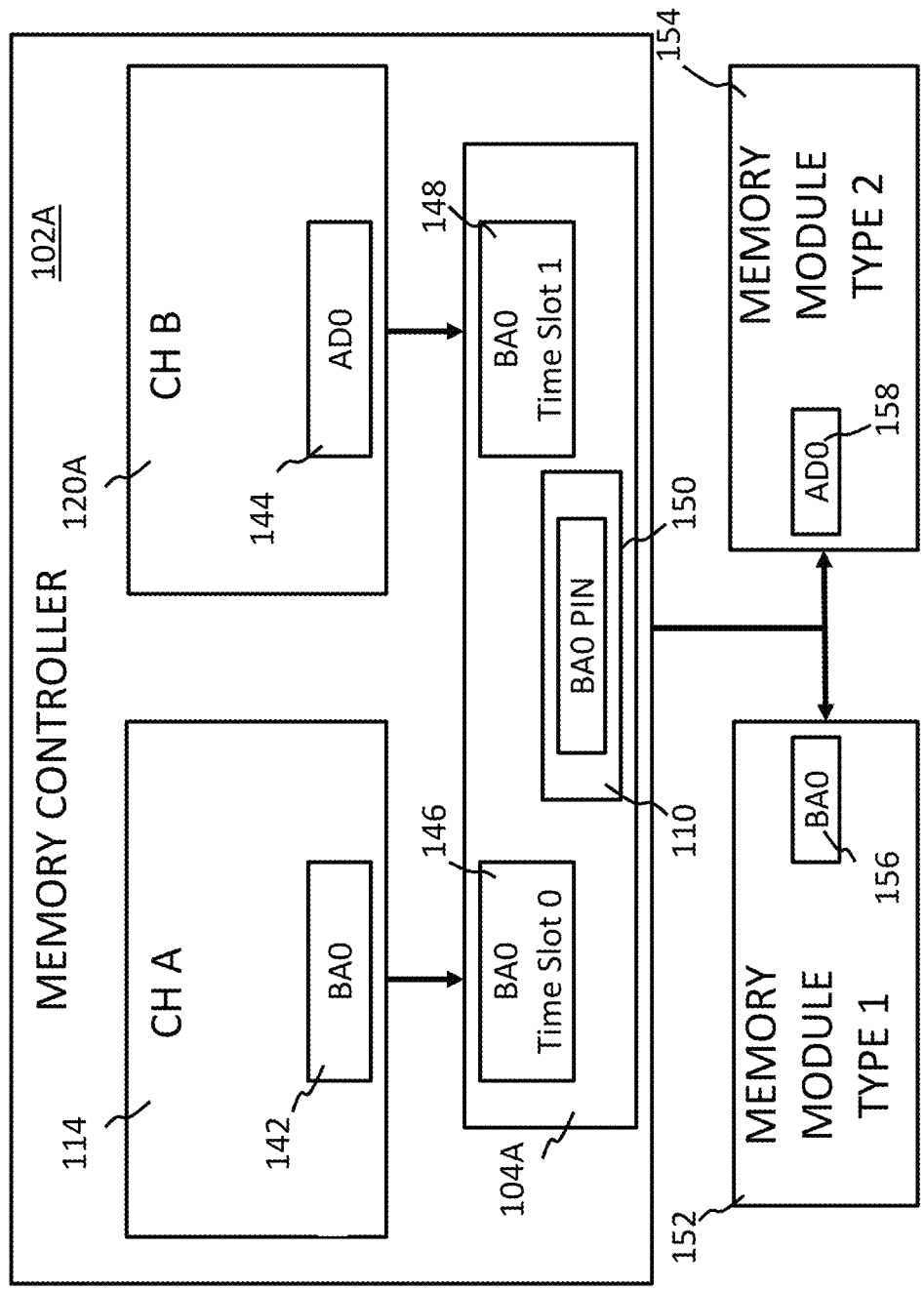
FIG. 1B schematically shows a multi-channel memory interface architecture in accordance with another embodiment of the present disclosure.

In some embodiments, however, one or more address pins of the physical interface may be mapped to a different usage for each channel. FIG. 1B schematically shows a memory controller 102A having a multi-channel memory interface architecture in accordance with another embodiment of the present disclosure. The memory controller 102A may comprise a first channel controller 114 and a second channel controller 120A, and a physical interface 104A. The first channel controller 114 may be the same as in FIG. 1A. The second channel controller 120A may be different from the second channel controller 120 in that at least some of the address outputs of the second channel controller 120A may be different and need to be mapped to pins at the physical interface 104A that may have a different usage as that for the first channel controller 114. The physical interface 104A may be different from the physical interface 104 in that the at least some connections to the channel controllers may not be shared by the channel controllers. For simplicity, portions of the memory controller 102 that may be the same as the memory controller 102 may be omitted (e.g., the data components and connections).

As shown in FIG. 1B, the physical interface 104A may have an address BA0 input 146 for a first time slot (e.g., Time Slot 0), an address BA0 input 148 for a second time slot (e.g., Time Slot 1), and a set of address/command pins 110. The set of address/command pins 110 may be the same as that of FIG. 1A but for illustration purpose it shows, as an example, how an address pin 150 (also may be referred to as an address pad) of the set of address/command pins 110 may be mapped for different usage for two different channels. The address pin 150 may be coupled to both address BA0 input 146 and address BA0 input 148 inside the physical interface 104A. The first channel controller 114 for channel A may have an address BA0 output 142 coupled to the address BA0 input 146 of the physical interface 104 and the second channel controller 120 for channel B may have an address AD0 output 144 coupled to the address BA0 input 148 of the physical interface 104. The set of address/command pins 110 may be coupled to a memory module 152 of a first memory type and a memory module 154 of a second memory type via an external address connection (e.g., an external bus). The address pad 150 may be coupled to an address pin BA0 156 of the memory module 152 and an address pin AD0 158 of the memory module 154. Thus, in this example, channel A's BA0 may be connected through BA0 input, output, pin throughout a memory system. However, channel B may be a SDRAM channel that is different from the memory protocol of channel A. AD0 (address 0) of the channel B controller 120 may be instead connected to BA0 time slot 1 of the address PHY and then connected back to the AD0 pin of SDRAM channel B via the BA0 Pad of the address PHY. Therefore, by providing multiple different inputs mapped to a same address pin on the address PHY but to work in a time division multiplexing manner, the memory controller 102A may facilitate memory types with different Input/Output (IO) pins to share the same address PHY. In an embodiment, the mapping of the address PHY may also allow for more optimal PCB (printed circuit board) layout because there may be fewer pins to be routed on a PCB.

It should be noted that in some embodiments, time division multiplexing may be achieved by allocating designated clock cycles (e.g., odd or even) to different channels (e.g., different memory modules attached to the address PHY via the set of address/command pins 110 and one shared external address bus). In some other embodiments, time division multiplexing may be realized by using a chip select (may be referred to, but not limited to, as a chip/channel select/enable) signal. The physical interface (e.g., 104, 104A) may comprise one or more chip select pins. In an embodiment, each memory channel (e.g., one memory module from multiple memory modules attached to the shared external address bus) may have a dedicated the chip select pin that is not shared with any other memory channels. The signal of the chip select pin for one memory channel may be asserted to an active state to select this memory channel to accept the address and command transmitted via the shared external address bus. If the signal of a chip select pin is not asserted to an active state, the corresponding memory channel may ignore the signals on the shared external address bus.

Figure 2:
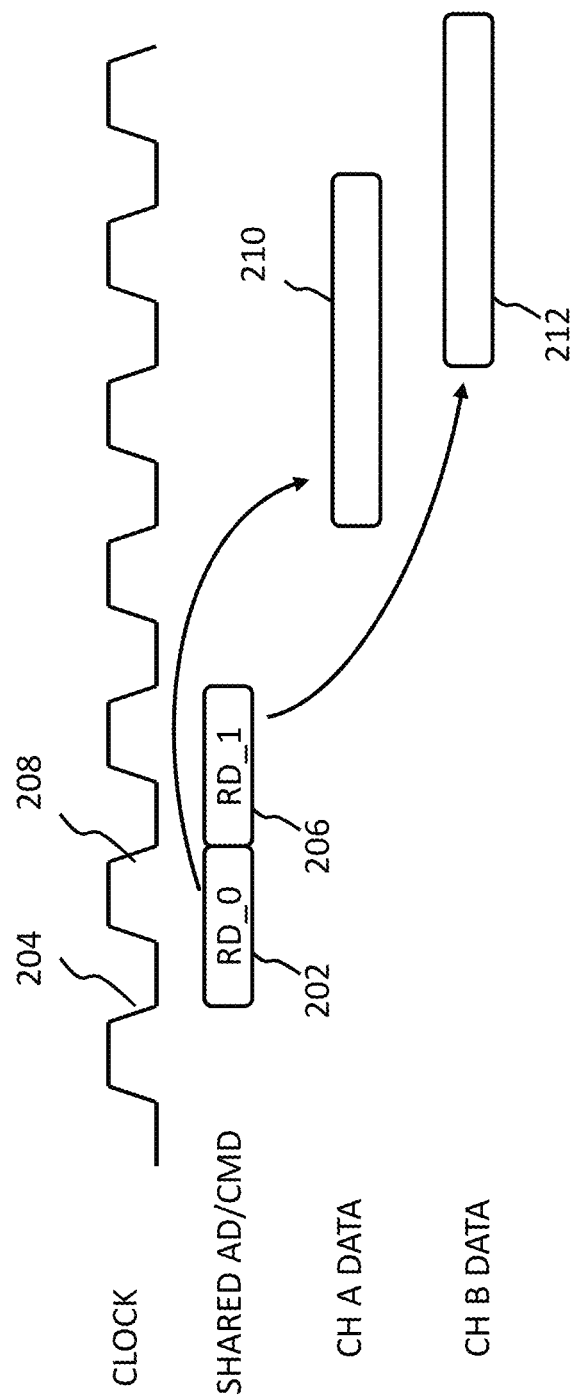
FIG. 2 schematically shows signals on various signal lines in a multi-channel storage system in accordance with an embodiment of the present disclosure.

FIG. 2 schematically shows signals on various signal lines in a multi-channel storage system in accordance with an embodiment of the present disclosure. In this embodiment, a first read command RD_0 202 for a first channel may be issued (e.g., by the first channel controller 114) on a down phase 204 of a clock cycle of the physical interface (e.g., of the physical interface 104 or 104A) via its address PHY, and a second read command RD_1 206 for a second channel may be issued on a down phase 208 of another clock cycle of the physical interface via the address PHY. The first channel may be the channel A of FIG. 1A or FIG. 1B that may have a first external data bus (not shown) of a first width (e.g., 8, 12, 16, 32-bits) and data may be sent back from a memory module attached to the external data bus to the physical interface (e.g., the physical interface 104 or 104A). The physical interface may in turn send the data to the channel controller 114 via a first internal data bus (e.g., data bus 112). As shown in FIG. 2, the data may be transmitted over more than one clock cycle.

The second channel may be the channel B of FIG. 1 that may have a second external data bus (not shown) of a second width (e.g., 8, 12, 16, 32-bits) and data may be sent back from a memory module attached to the second external data bus to the physical interface (e.g., the physical interface 104 or 104A). The second width may be the same size as the first width of the first external bus in one embodiment, or a size different from the first width in another embodiment. In an embodiment, for example, the first external and internal data bus may be 32 bits, and the second external and internal data bus may be 8 bits or 16 bits. As shown in FIG. 2, the data from the second external data bus may include data bits being transmitted over more than one clock cycle. The physical interface may in turn send the data to the channel controller 120 (or channel controller 120A) via a second internal data bus (e.g., data bus 126). Because each of the channels have dedicated internal and external data buses, the time slots 210 and 212 for transmission of the data signals may overlap. But both read commands 202 and 206 may share the same set of address/command pins 110.

Figure 3:
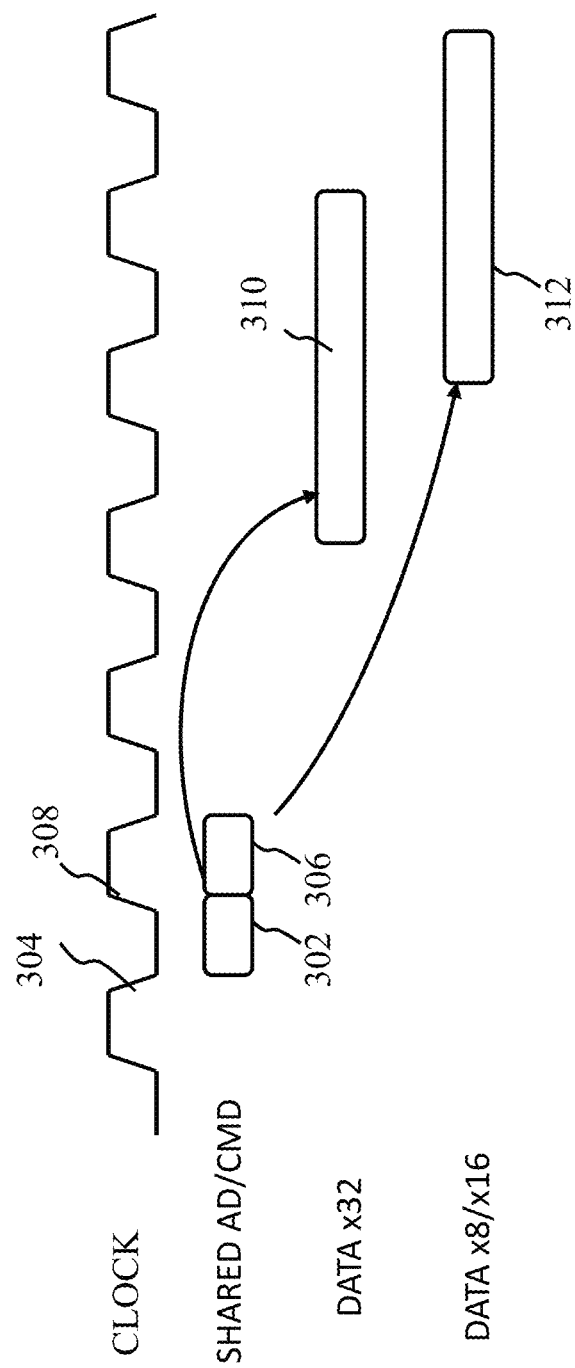
FIG. 3 schematically shows signals on various signal lines in a multi-channel storage system in accordance with another embodiment of the present disclosure.

FIG. 3 schematically shows signals on various signal lines in a multi-channel storage system in accordance with another embodiment of the present disclosure. In this embodiment, a time slot of the address PHY of a physical interface (e.g., the physical interface 104 or 104A) may be one half clock cycle of the physical interface. A first read command 302 for a first channel (e.g., CH A) may be issued on a down phase 304 of a clock cycle of the physical interface, and a second read command 304 for a second channel (e.g., CH B) may be issued on an up phase 308 of a clock cycle of the physical interface. Both read commands 302 and 306 may share the set of address/command pins 110. The first channel and second channel may have dedicated internal and external data buses, and thus the time slots for transmission of the data signals 310 and 312 may overlap.

Figure 4:
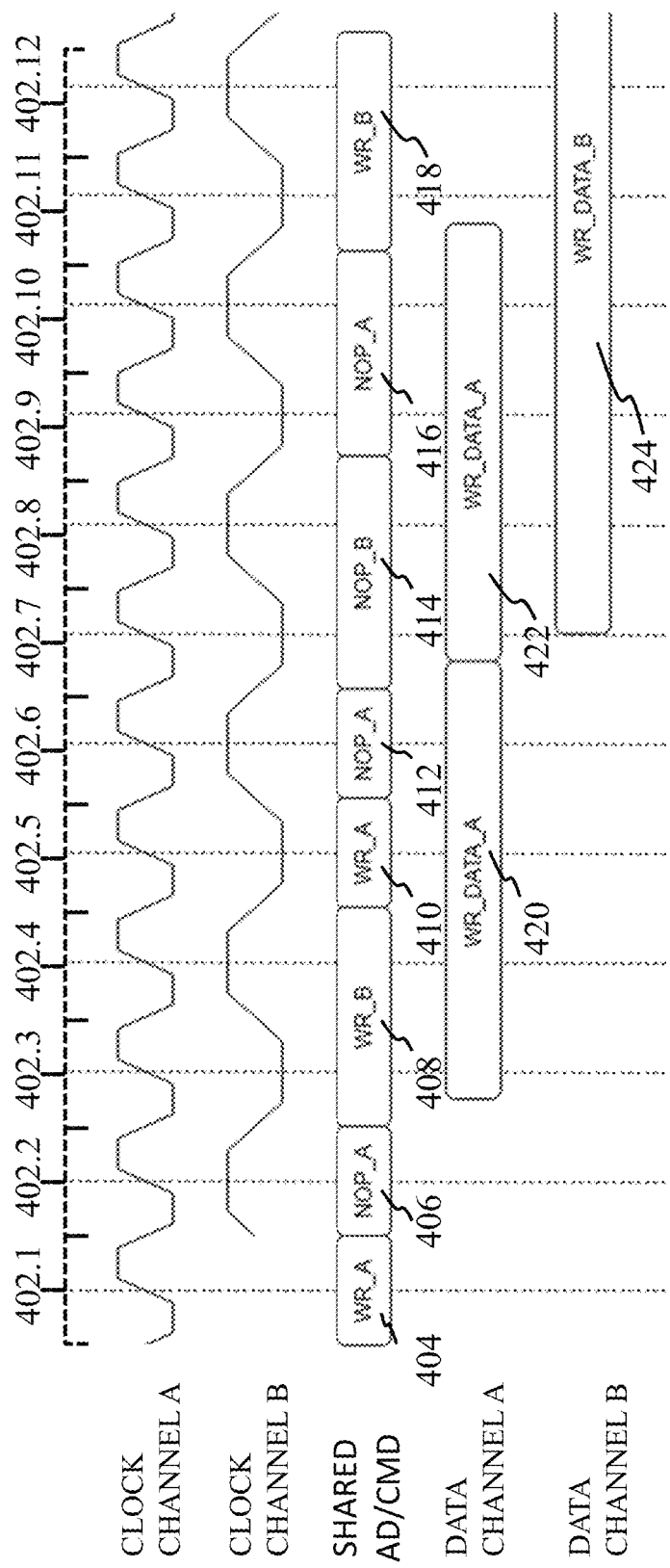
FIG. 4 schematically shows signals on various signal lines in a multi-channel storage system in accordance with yet another embodiment of the present disclosure.

FIG. 4 schematically shows signals on various signal lines in a multi-channel storage system in accordance with yet another embodiment of the present disclosure. In this embodiment, a first channel controller (e.g., channel controller 114) may have a first channel clock (e.g., CLOCK CHANNEL A) and a second channel controller (e.g., channel controller 114 or 114S) may have a second channel clock (e.g., CLOCK CHANNEL B). The first channel clock may be twice as fast as the second channel clock. The physical interface clock for the address channel may be determined by the channel with highest frequency. As shown in FIG. 4, the physical interface may operate at a clock frequency that have clock cycles 402.1 through 402.12 and match the frequency of the first channel clock. Each of the clock cycles 402.1 through 402.2 may be one half of a clock cycle of the second channel clock. The first channel may have designated time slots that include two continuous PHY clock cycles (e.g., PHY clock cycles 402.1-402.2, 402.5-402.6, 402.9-402.10) and the second channel may have designated time slots that also include two continuous PHY clock cycles (e.g., PHY clock cycles 402.3-402.4, 402.7-402.8 and 402.11-402.12). Because two different channels may operate at different frequencies, the memory modules may operate at different frequencies. Some PHY pins such as clock cannot be shared in this case. For example, the physical interface may comprise a first clock pin for the first channel and a second clock pin for the second channel. In an embodiment, the rising edge of channel B clock (e.g., the clock signal line coupled to memory module of channel B) may be locked to every other falling edge of channel A clock (e.g., the clock signal line coupled to memory module of channel A).

Because the first channel may operate at the same frequency of the PHY clock, the first channel controller may issue two commands during a designated time slot. For example, during the PHY clock cycles 402.1-402.2, the first channel controller may issue two commands: a write command 404 and a no-operation (NOP) command 406; and during the PHY clock cycles 402.5-402.6, the first channel controller may issue two commands: a write command 410 and a NOP command 412. Please note that the NOP command may be special in that when the designated time slot has nothing to do, one NOP command, such as the NOP command 416 may occupy the whole designated time slot of PHY clock cycles 402.9-402.10.

Because the second channel may operate at a frequency that is half of the PHY clock, the second channel controller may issue one command during a designated time slot of two PHY clock cycles. For example, during the PHY clock cycles 402.3-402.4, the second channel controller may issue a write command 408; during the PHY clock cycles 402.7-402.8, the second channel controller may issue a NOP command 414; and during the PHY clock cycles 402.11-402.12, the second channel controller may issue a write command 418. It should be note in any example of the present disclosure, a read command may be replaced by a write command or any other commands, and a write command may be replaced by a read command or any other commands, and the address PHY may operate in the same time division multiplexing manner.

An exemplary multi-channel memory controller may thus combine memories running at different frequencies and this may be achieved by combining channels running at a power-of-2 frequency ratio. The PHY clock for the address channel may be determined by the channel with highest frequency. Because different memory types may have different maximum operating frequencies, an embodiment may allow a faster memory type to run at or near its maximum frequency instead of being limited to a slower memory clock. In one embodiment, however, some sacrifice to the operating frequency may be required in order to match the frequency ratio.

Figure 5:
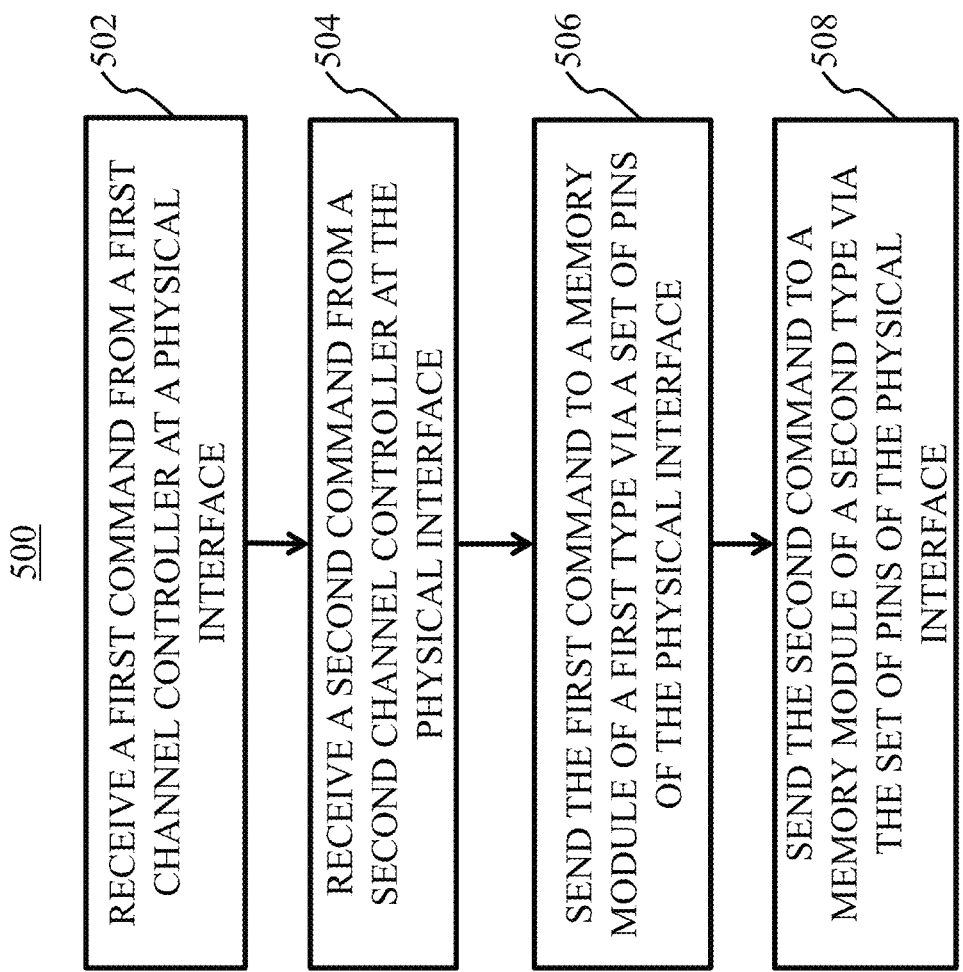
FIG. 5 is a flowchart for operating a multi-channel memory controller in accordance with an embodiment of the present disclosure.

FIG. 5 is a flowchart of a process 500 for operating a multi-channel memory controller in accordance with an embodiment of the present disclosure. In block 502, a first command from a first channel controller may be received at a physical interface. The first channel controller and the physical interface may be two components of the multi-channel memory controller. For example, the physical interface 104 or 104A of the memory controller 102 and 102A may receive a first command (e.g., the read command 202 or 302, or write command 404) from the first channel controller 114.

In block 504, a second command from a second channel controller may be received at the physical interface. The second channel controller may be another component of the multi-channel memory controller. For example, the physical interface 104 or 104A of the memory controller 102 and 102A may receive a second command (e.g., the read command 206 or 306, or write command 408) from the second channel controller 120 or 120A. The first command may be a command of a first protocol and the second command may be a command of a second protocol, and the first protocol may be different from the second protocol. For example, the first channel controller may be configured for DDR3 and the second channel controller may be configured for DDR4 in an embodiment. A memory module used for the first channel may be a DDR3 memory module and a memory module used for the second channel may be a DDR4 memory module. Thus, the first protocol may be DDR3 and the second protocol may be DDR4. In another example, the first channel controller may be configured for SDRAM and the second channel controller may be configured for MRAM in another embodiment. A memory module used for the first channel may be a SDRAM memory module and a memory module used for the second channel may be a MRAM memory module. Thus, the first protocol may be SDRAM and the second protocol may be MRAM.

In block 506, the first command may be sent from the physical interface to a first memory module of a first memory type during a first time slot via a set of pins. In block 508, the second command may be sent from the physical interface to a second memory module of a second memory type during a second time slot via the set of pins. In various embodiments, one set of pins (e.g., the set of address/command pins 110) of the physical interface may be shared among multiple channels by time division multiplexing. The first channel's command may be issued in a first time slot and the second channel's command may be issued in a second time slot. In an embodiment, each channel may have a designated time slot. In another embodiment, the time slot for a channel may be determined by a chip select signal. Further, in an embodiment, the chip select signal may be issued via one of the shared set of pins.

Embodiments according to the present disclosure may reduce pins on the physical interface and thus save area, power and cost for a memory controller. By using time division multiplexing, embodiments may combine different memory types, map different signals of multiple channels to the same pin of the physical interface, run each channel at a different data rate, and combine different I/O protocols.

In an exemplary embodiment, there is provided an apparatus, comprising: a first memory controller configured to access a first channel using a first protocol; a second memory controller configured to access a second channel using a second protocol that is different from the first protocol; and a physical interface coupled to the first memory controller and a second memory controller. The physical interface comprises a set of pins for an address and command bus shared by the first memory controller and the second memory controller for the first memory controller and the second memory controller to send address or command to respective channels by time division multiplexing.

In one embodiment, the first protocol and the second protocol may be compatible protocols.

In one embodiment, the physical interface may further comprise at least a first address input coupled to the first memory controller and a second address input coupled to the second memory controller, and the first address input and second address input are mapped to one shared pin of the set of pins.

In one embodiment, the first address input and second address input may be configured to work in different time slots.

In one embodiment, the time division multiplexing may be achieved by allocating designated different clock cycles to different channels.

In one embodiment, the time division multiplexing may be performed using a chip select signal transmitted via one of the set of pins for the address and command bus.

In one embodiment, the first memory controller may operate an address bus at a first frequency and the second memory controller may operate an address bus at a second frequency that is different from the first frequency.

In one embodiment, the physical interface may operate at a highest frequency of the first frequency and second frequency.

In one embodiment, the physical interface may further comprise a first clock pin for the first channel and a second clock pin for the second channel.

In one embodiment, the physical interface may further comprise separate sets of pins for data buses for the first channel and second channel respectively.

In another exemplary embodiment, there is provided a method, comprising: receiving a first command from a first channel controller of a multi-channel memory controller at a physical interface of the multi-channel memory controller; receiving a second command from a second channel controller of the multi-channel memory controller at the physical interface. The first command may be a command of a first protocol and the second command may be a command of a second protocol, and the first memory protocol may be different from the second memory protocol. The method may further comprise sending the first command during a first time slot from the physical interface via a set of pins to a first memory module of a first memory type; and sending the second command during a second time slot from the physical interface via the set of pins to a second memory module of a second memory type. The set of pins may be shared by the first channel and second channel. In one embodiment, the first protocol and the second protocol may be compatible protocols.

In one embodiment, the method may further comprise mapping a first address input of the physical interface and a second address input of the physical interface to one shared pin of the set of pins. The first address input and second address input may be configured to work in different time slots.

In one embodiment, the first time slot and second time slot may be different clock cycles assigned to different channels.

In one embodiment, the method may further comprise transmitting a chip select signal via the set of pins to indicate which of the first memory module and second memory module is a target of a command being sent.

In one embodiment, the method may further comprise operating an address bus of the first channel controller at a first frequency and an address bus of the second memory controller at a second frequency that is different from the first frequency. The physical interface may operate at a highest frequency of the first frequency and second frequency.

In yet another exemplary embodiment, there is provided a non-transitory machine-readable medium having information, which when read by a hardware processor system, causes the hardware processor system to perform: receiving a first command from a first channel controller of a multi-channel memory controller at a physical interface of the multi-channel memory controller; receiving a second command from a second channel controller of the multi-channel memory controller at the physical interface; sending the first command during a first time slot from the physical interface via a set of pins to a first memory module of a first memory type; and sending the second command during a second time slot from the physical interface via the set of pins to a second memory module of a second memory type. The first command may be a command of a first protocol and the second command may be a command of a second protocol, and the first memory protocol may be different from the second memory protocol. The set of pins may be shared by the first channel and second channel.

In one embodiment, the information, when read by the hardware processor system, further causes the hardware processor system to perform: mapping a first address input of the physical interface and a second address input of the physical interface to one shared pin of the set of pins. The first address input and second address input may be configured to work in different time slots.

In one embodiment, the information, when read by the hardware processor system, further causes the hardware processor system to perform: transmitting a chip select signal via the set of pins to indicate which of the first memory module and second memory module is a target of a command being sent.

In one embodiment, the information, when read by the hardware processor system, further causes the hardware processor system to perform: operating an address bus of the first channel controller at a first frequency and an address bus of the second memory controller at a second frequency that is different from the first frequency. The physical interface may operate at a highest frequency of the first frequency and second frequency.

Any of the disclosed methods and operations (e.g., the process 500) may be implemented as computer-executable instructions (e.g., software code for the operations described herein) stored on one or more computer-readable storage media (e.g., non-transitory computer-readable media, such as one or more optical media discs, volatile memory components (such as DRAM or SRAM), or nonvolatile memory components (such as hard drives)) and executed on a device controller (e.g., firmware executed by ASIC). Any of the computer-executable instructions for implementing the disclosed techniques as well as any data created and used during implementation of the disclosed embodiments can be stored on one or more computer-readable media (e.g., non-transitory computer-readable media).

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

What is claimed is:

1. An apparatus, comprising:
   a first channel controller configured to provide a first channel using a first protocol;
   a second channel controller configured to provide a second channel using a second protocol that is different from the first protocol; and
   a physical interface coupled to the first channel controller and the second channel controller, the physical interface comprising:
      a set of address pins for an address and command bus coupled to the first channel controller and the second channel controller and shared by the first channel controller and the second channel controller; and
      at least a first address input coupled to the first channel controller and a second address input coupled to the second channel controller, and the first address input and the second address input are mapped to one shared pin of the set of address pins,
      wherein the first channel controller is configured to send an address or a command to the address and command bus during a first time slot via the set of address pins and the second channel controller is configured to send an address or a command to the address and command bus during a second time slot via the set of address pins.

2. The apparatus of claim 1, wherein the first protocol and the second protocol are compatible protocols.

3. The apparatus of claim 1, wherein the first address input and second address input are configured to work in different time slots.

4. The apparatus of claim 1, wherein one of the set of address pins is configured to transmit a chip select signal to the address and command bus.

5. The apparatus of claim 1, wherein the first channel controller is configured to operate the first channel and use the set of address pins at a first frequency and the second channel controller is configured to operate the second channel and use the set of address pins at a second frequency that is different from the first frequency.

6. The apparatus of claim 5, wherein the physical interface is configured to operate at a highest frequency of the first frequency and second frequency.

7. The apparatus of claim 5, wherein the physical interface further comprises a first clock pin for the first channel and a second clock pin for the second channel.

8. A method, comprising:
   receiving a first command from a first channel controller of a multi-channel memory controller at a physical interface of the multi-channel memory controller, the first channel controller providing a first channel to the multi-channel memory controller;
   receiving a second command from a second channel controller of the multi-channel memory controller at the physical interface, the second channel controller providing a second channel to the multi-channel memory controller, wherein the first command is a command of a first protocol and the second command is a command of a second protocol, and the first memory protocol is different from the second memory protocol;
   sending the first command during a first time slot from the physical interface via a set of address pins to a first memory module of a first memory type; and
   sending the second command during a second time slot from the physical interface via the set of address pins to a second memory module of a second memory type, the set of address pins shared by the first channel and second channel, wherein the physical interface comprises at least a first address input coupled to the first channel controller and a second address input coupled to the second channel controller, and the first address input and the second address input are mapped to one shared pin of the set of address pins.

9. The method of claim 8, wherein the first protocol and the second protocol are compatible protocols.

10. The method of claim 8, wherein the first time slot and second time slot are different clock cycles assigned to different channels.

11. The method of claim 8, further comprising transmitting a chip select signal via the set of address pins to indicate which of the first memory module and second memory module is a target of a command being sent.

12. The method of claim 8, further comprising operating the first channel provided by the first channel controller at a first frequency and the second channel provided by the second channel controller at a second frequency that is different from the first frequency, wherein the first command is transmitted via the set of address pins according to the first frequency and the second command is transmitted via the set of address pins according to the second frequency, wherein the physical interface is operating at a highest frequency of the first frequency and second frequency.

13. A non-transitory machine-readable medium having information, wherein the information, when read by a hardware processor system, causes the hardware processor system to perform:
   receiving a first command from a first channel controller of a multi-channel memory controller at a physical interface of the multi-channel memory controller, the first channel controller providing a first channel to the multi-channel memory controller;
   receiving a second command from a second channel controller of the multi-channel memory controller at the physical interface, the second channel controller providing a second channel to the multi-channel memory controller, wherein the first command is a command of a first protocol and the second command is a command of a second protocol, and the first memory protocol is different from the second memory protocol;
   sending the first command during a first time slot from the physical interface via a set of address pins to a first memory module of a first memory type; and
   sending the second command during a second time slot from the physical interface via the set of address pins to a second memory module of a second memory type, the set of address pins shared by the first channel and second channel, wherein the physical interface comprises at least a first address input coupled to the first channel controller and a second address input coupled to the second channel controller, and the first address input and the second address input are mapped to one shared pin of the set of address pins.

14. The non-transitory machine-readable medium of claim 13, wherein the information, when read by the hardware processor system, further causes the hardware processor system to perform:
transmitting a chip select signal via the set of address pins to indicate which of the first memory module and second memory module is a target of a command being sent.

15. The non-transitory machine-readable medium of claim 13, wherein the information, when read by the hardware processor system, further causes the hardware processor system to perform:
operating the first channel provided by the first channel controller at a first frequency and the second channel provided by the second channel controller at a second frequency that is different from the first frequency, wherein the first command is transmitted via the set of address pins according to the first frequency and the second command is transmitted via the set of address pins according to the second frequency, wherein the physical interface is configured to operate at a highest frequency of the first frequency and second frequency.

* * * * *